United States Patent [19]

Buschow et al.

[11] 4,401,522
[45] Aug. 30, 1983

[54] PLATING METHOD AND APPARATUS

[75] Inventors: Adolph G. Buschow, Largo; Charles D. Eidschun, Seminole, both of Fla.

[73] Assignee: Micro-Plate, Inc., Clearwater, Fla.

[21] Appl. No.: 192,424

[22] Filed: Sep. 29, 1980

[51] Int. Cl.³ .................... C25D 5/02; C25D 17/06; C25D 17/28
[52] U.S. Cl. .................................. 204/15; 204/203; 204/224 R
[58] Field of Search ............... 204/15, 202, 203, 206, 204/224 R

[56] References Cited

U.S. PATENT DOCUMENTS

| | | | |
|---|---|---|---|
| 1,556,045 | 10/1925 | Swain | 204/203 |
| 1,793,551 | 2/1931 | Jording | 204/203 |
| 2,212,588 | 8/1940 | Csanyi | 204/206 |
| 2,490,055 | 12/1949 | Hoff | 204/206 |

Primary Examiner—T. M. Tufariello
Attorney, Agent, or Firm—Jack E. Dominik

[57] ABSTRACT

The present invention deals with the continuous metal exchange for workpieces such as a printed circuit board which can take place in a plating tank. The workpieces are conveyorized for continuous horizontal transport into and out of a plating tank. Opposite ends of the tank are provided with slots to receive and discharge the workpieces which are sealed, in the instance illustrated, by opposed rollers or an open slot of small area to prevent leakage in excess of the pump capacity. The workpieces are suspended at their upper portion by a nonconductive hanger, the lower portion of which is rendered conductive. When the workpiece enters the plating tank the conductive portion of the hanger suspending the workpiece from the conveyor, makes contact to energize bus bars thereby converting the workpiece to a cathode (or anode if metal is to be removed). A plating solution is inside of the tank and provided with anodes or cathodes energized for metal exchange. The method is directed to conveyorizing workpieces for continuous horizontal transport, sealing the opposite ends of a tank while providing for passing the workpieces through the seal at the ends of the tank, rendering the workpieces conductive while in the tank, and providing a fluid in the tank energized for metal exchange in ultimate contact with sufficient agitation (from the spargers) at the anodes and cathodes to prevent polarization during high speed plating.

22 Claims, 11 Drawing Figures

Fig. 8

PLATING METHOD AND APPARATUS

FIELD OF INVENTION

The present invention is directed to a method and apparatus for continually processing flat workpieces for metal exchange. More particularly, the invention finds its utility in the plating or deplating of printed circuit boards.

SUMMARY OF THE PRIOR ART

Printed circuit boards, for electronic applications, are normally formed of a relatively inert material such as fiberglass reinforced board. Initially using the common subtractive process they are clad, primarily with a thin coat of copper. This cladding is normally on both sides. Thereafter in order to form the circuit a photoresist is applied to one or both sides of the board. The photoresist is essentially inert to the plating processes, and after exposing and developing defines by voids in the photoresist the circuit which is to be plated. Thereafter the boards are electrically charged becoming a cathode target, and placed in a solution carrying the metal to be deposited. Usually this is copper, tin lead, tin, nickel, or gold. After the metal has been deposited to the predetermined thickness, as in the case of copper, the boards are then washed and subsequently the plated portion is again plated with a tin lead type solder. The tin lead covering is usually plated in essentially the same manner as the copper.

Subsequently the photoresist is removed, and the cladded copper layer is etched off the board. Remaining is the circuit which has been plated to the board covered with the tin lead which is an etch resist since it is not dissolved by the etchant. In some applications, the tin lead may be reflowed, or stripped (removed). In other applications it serves as a solderable surface for joining other electronic components to the printed circuit board.

The above processes are presently carried out in a batch fashion, the boards being positioned (vertically inside) of a plating tank. Considerable handling and monitoring of the processes is required to produce uniformly consistent boards. Depending upon the concentrations of fluid in the plating tanks, and the extent to which they are evenly agitated, and the anode-cathode relationship, the plating can be uneven and non-uniform. Spoilage can result from thumb prints or other marks left by the handling as the boards are moved from station-to-station.

SUMMARY

The present invention deals with the continuous metal exchange for workpieces such as a printed circuit board. The workpieces are conveyorized for continuous horizontal transport while oriented vertically into and out of a plating tank. Opposite ends of the tank are provided with vertical slots to receive and discharge the workpieces and are sealed, in the instance illustrated, by opposed rollers. The workpieces are suspended at their upper portion by a non-conductive hanger, the lower portion of which is rendered conductive. When the workpiece enters the plating tank the conductive portion of the hanger suspending the workpiece from the conveyor is energized thereby converting the workpiece to a cathode (or anode if metal is to be removed). A plating solution is inside of the tank and provided with anodes or cathodes energized for metal exchange.

The method is directed to conveyorizing workpieces for continuous horizontal transport while vertically oriented, sealing the opposite ends of a tank while providing for passing the workpieces through the seal at the ends of the tank, rendering the workpieces conductive to a power supply while in the tank, and providing a fluid in the tank for metal exchange in intimate contact with the workpiece.

The alternate method and apparatus is directed to conveyorizing the workpieces for continuous horizontal transport while vertically oriented, then conveying the workpieces downward into a tank of metal exhange solution and upward out of the tank, thus eliminating any sealing at the tank ends, then continuing to convey the workpieces to other processing stations.

In view of the foregoing it is a primary object of the present invention to provide for continuous metal exchange of flat workpieces such as printed circuit boards in a modular station which can be coupled by means of its conveyor to other processing stations.

A principal object of the present invention is to provide a plating method and apparatus in which higher plating current densities in the range of 100 to 500 amps per square foot can be employed, thus increasing plating speeds without sacrificing quality. In the prior art current densities employed for plating printed circuit boards are less than 100 amps per square foot. The processing speeds as well as high current density are achieved by a high agitation rate and flow rate of the plating solution.

Another object of the present invention is to provide a plating station and method which insures uniformity of plating or deplating in a continuous fashion by conveying the workpiece through the solution and anodes or cathodes resulting in an averaging effect and more uniform metal exchange, thus plating, a more evenly distributed thickness of plated metal, also the high and uniform solution flow from the spargers (90% to workpiece-10% to the anodes) allow higher current densities, resulting in a much greater plating speed.

Another object of the present invention is to minimize the handling of workpieces such as printed circuit boards thereby reducing the possibility of damage during the processing which can result in rejected product.

A further but also significant object of the present invention is to provide a chain plate on the work hangers for the printed circuit boards which becomes a continuous travelling lid over the unit thereby minimizing vapors and spray mist from leaving the process cells. This substantially reduces the open slot area on the process cells to reduce ventilation needs where the method and apparatus are employed to a very low level. This results in an energy efficient as well as environmentally acceptable process.

Another and important object of the present invention is to provide for the continuous metal exchange with workpieces such as printed circuit boards which achieves the above objectives and is economical and efficient to operate.

DESCRIPTION OF DRAWINGS

Further objects and advantages of the present invention will become apparent as the following description of an illustrative embodiment proceeds taken in conjunction with the accompanying drawings, in which.

DESCRIPTION OF ILLUSTRATIVE EMBODIMENT

Figure 1:
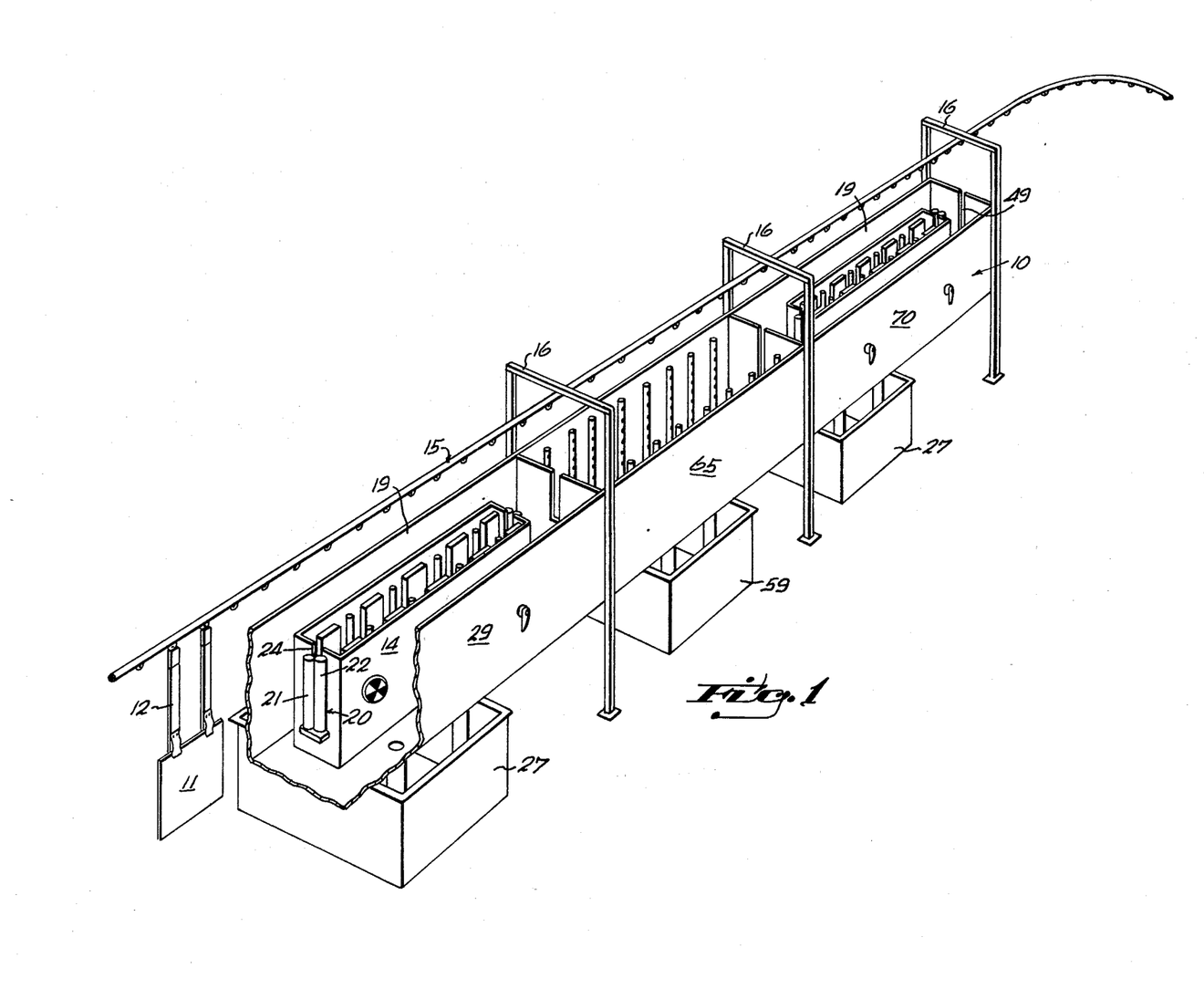
FIG. 1 is a perspective diagrammatic view of an illustrative station, coupled with other modules, in this instance for first copper plating, rinsing, and then tin lead plating of printed circuit boards.

Shown in FIG. 1 is a modular organization of the subject plating station 10 along with two further stations, the second for rinsing or otherwise processing the plated printed circuit board 11, and a further station substantially identical with the plating station 10 which, rather than plating copper, is used to plate a tin lead over the copper plated printed circuit board 11. The PC boards 11 are suspended by means of a work hanger 12 and are passed to the inner plating tank 14 by means of the horizontal conveyor 15. The horizontal conveyor 15 is desirably supported by the conveyor frames 16 which support not only the conveyor, but the outer tank 19, inner plating tank 14, conveyor 15 and workpiece hanger 12 in fixed coordinated relationship. Plastic chain plates 17 (shown in FIG. 9) are provided to prevent fumes from escaping from the process chambers. The plastic chain plates ride on the surface of the process chamber closing the gap which allows the workpiece hanger to extend into the process chamber. In order to reduce the length of the illustrative plating station 10 and maximize the utilization in the plating tank 14, a roller seal assembly 20 is provided at each end of the inner plating tank. The roller seal assembly includes a pair of rollers 21 and 22 positioned vertically and in flanking relationship with the entry slot 24 provided at each end of the inner plating tanks 14. Hard disc wear surfaces 18 (see FIG. 4) are provided at the lower end of the two rollers 21 and 22 to be in constant contact thereby minimizing leakage and friction at the lower portion of the roller assembly 20. Some leakage is contemplated as the printed circuit boards 11 drivingly pass between the rollers 21 and 22, and spread the elastomeric surface of the rollers somewhat in order to pass through the roller seal assembly 20.

Figure 3:
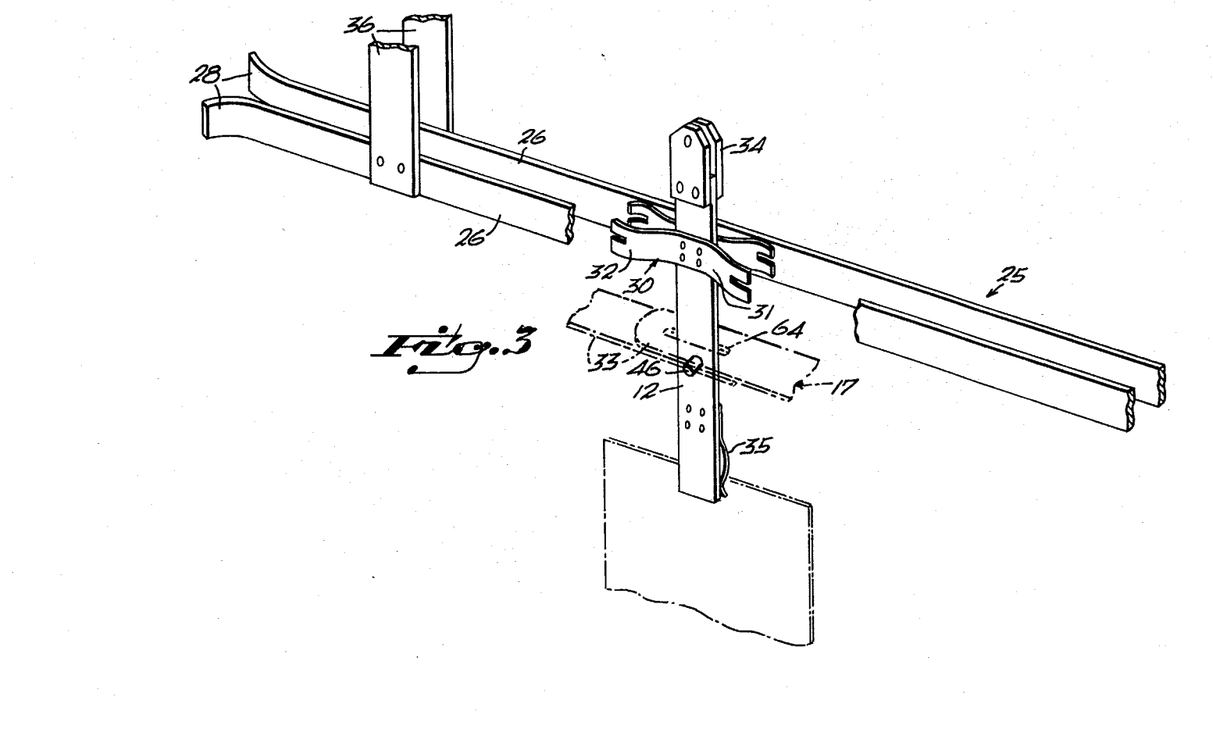
FIG. 3 is a perspective partially diagrammatic view of the electrical contact track and shoes for energizing the workpiece, shown as a printed circuit board.

When the work hanger 12 passes adjacent the entry slot 24, a contact track assembly 25 as shown in FIG. 3 is engaged. A contact shoe assembly 30 is provided at a position on the work hanger 12 having opposed contact springs 31 provided with rounded ends 32. As the work hanger 12, carried along by the conveyor 15 to position the printed circuit board 11 for passing through the roller seal assembly 20, the contact shoe assembly is received by the flaired ends 28 of each of the contact bars 26. The upper non-conductive connector 34 which is fastened to the conveyor 15 suspends the lower conductive portion of the work hanger 12 so that the contact shoe assembly 30 frictionally engages the contact track assembly 25. The PC board 11 is secured and energized by means of a clip 35 on the lower conductive portion of the work hanger 12. The contact track assembly 25 is energized by means of the track bus bars 36. At the discharge end of the contact track 25 similar flaired ends 28 permit the contact shoe assembly to pass out of the contact track assembly 25 and thereafter become electrically neutral.

Figure 9:
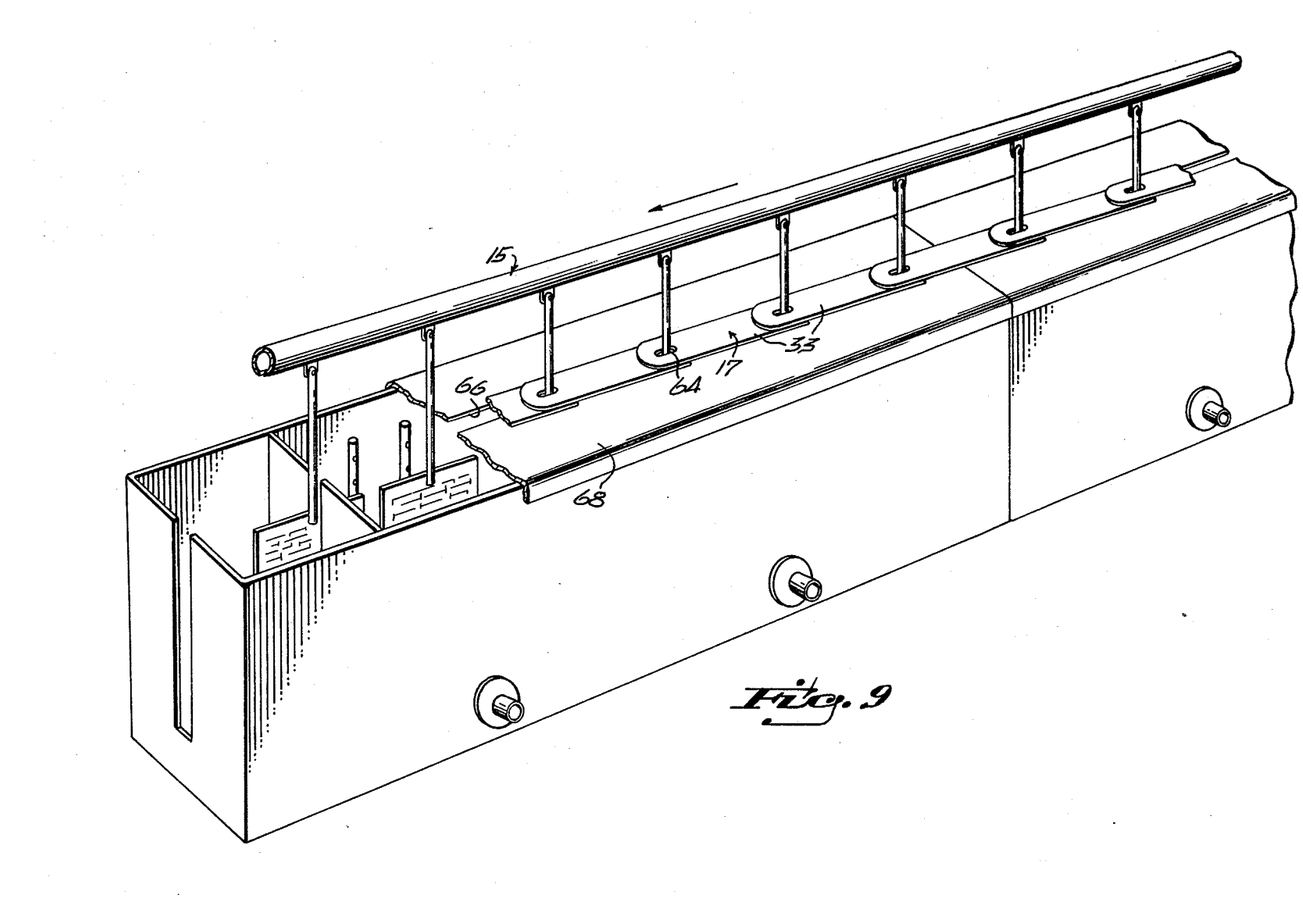
FIG. 9 is a further perspective view, partially broken away, illustrating the cover plate of the tanks and the means by which the various racks and floating lids are secured in sealed relationship to the tanks.

To be noted in FIG. 9 is the chain plate assembly 17, made up of individual chain links 33. The chain links 33 are provided to overlap the slot 66 in the outer tank cover 68 to prevent fumes from escaping from the process chambers. The plastic chain links 33 ride on the surface, thus closing the gap or slot 66 and yet allowing the workpiece hangers 12 to extend into the process chambers in oriented fashion, further shielding the contact track assembly 25 and the contact shoe assembly 30 from such fumes and their attendent corrosive effects. A pin 46 (shown in FIG. 3) is positioned transversely of the workpiece hangers 12 beneath the chain link slot 64 and extends a distance less than the width of the cover slot 66.

While the means for shielding has been shown and described the form of a plastic link 17 overlying the slot 66 and the cover 68, it will be appreciated that other means may be employed. For example, flexible wipers may be positioned and secured adjacent the slot 66 to overlap the same, and flexibly permit the passage of the work hanger 12 and its workpiece 11. Alternatively, a pair of longitudinal manifolds flanking on each side of the central slot 66, and directing a flow of pressurized air down into the slot will significantly impede the passage of spray, fumes, contaminants and the like into the ambient air.

Figure 2:
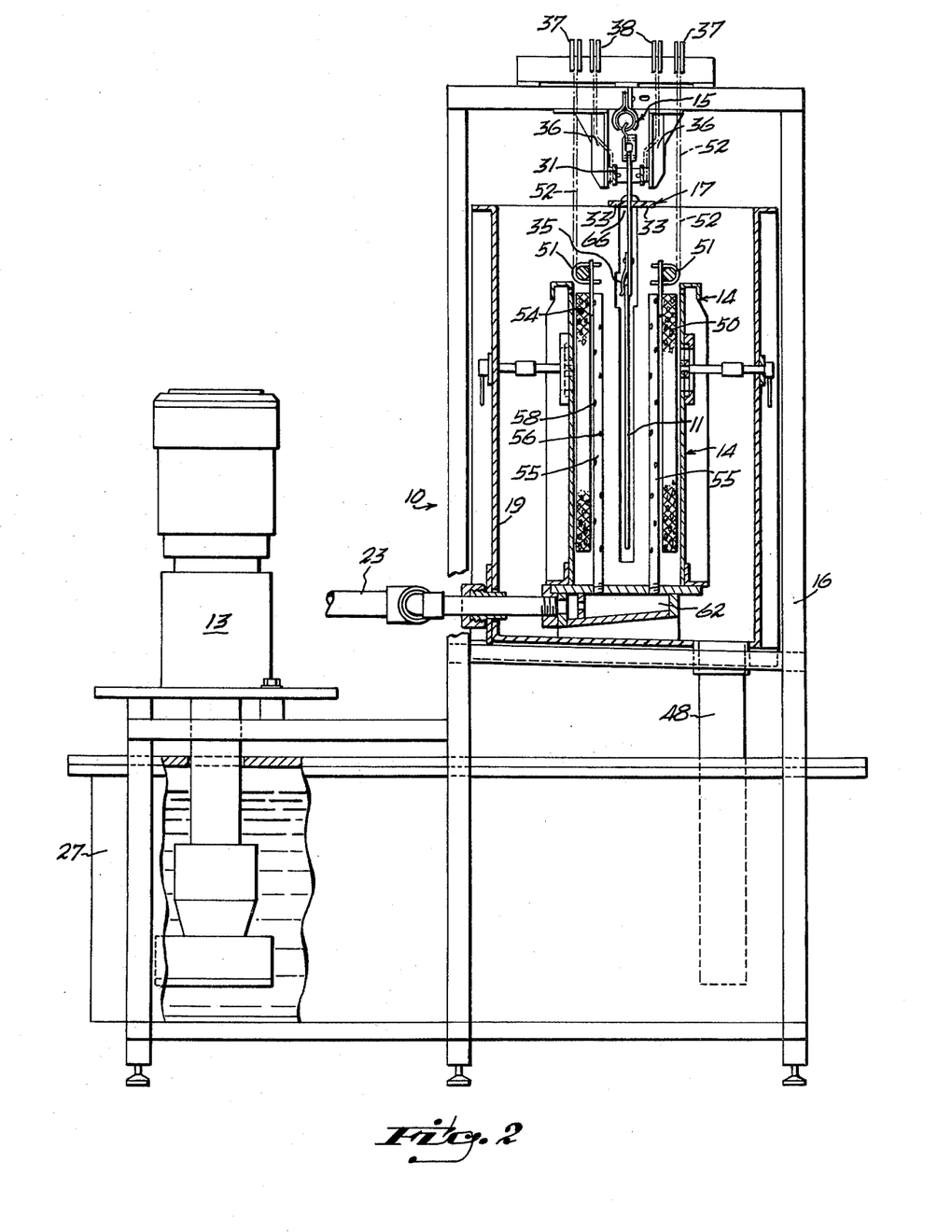
FIG. 2 is a transverse section view of the interior portion of the plating station.

The contact track assembly 25 and contact shoe assembly 30 are electrically activated by the negative bussing 38 (see FIG. 2). The positive bussing 37 is directed to the anode baskets 50. The track buss 36 is fed by the negative bussing 38.

Figure 4:
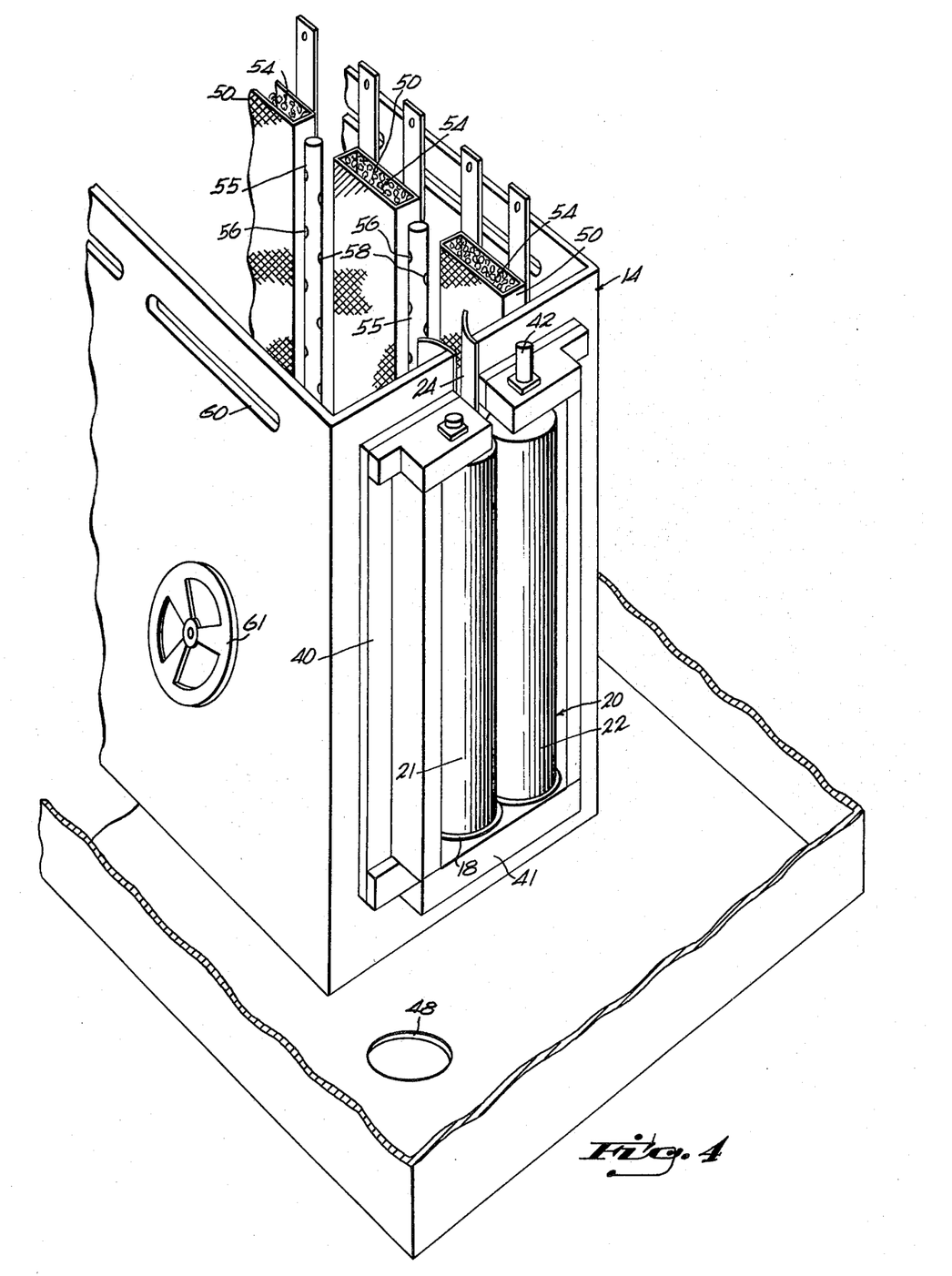
FIG. 4 is a perspective partially diagrammatic view of the end of the station showing the opposed rollers and diagrammatically illustrating the position of anode baskets and plating spargers, also the solution level control gates.
Figure 5:
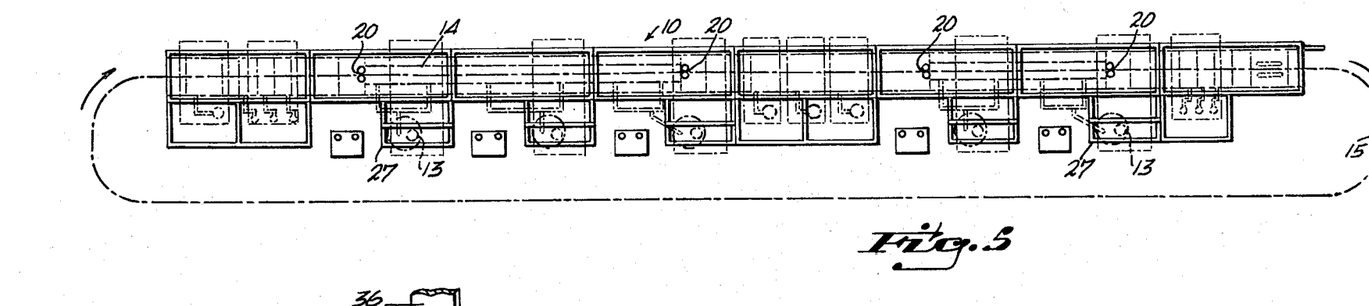
FIG. 5 is a plan view of the subject plating station.
Figure 6:
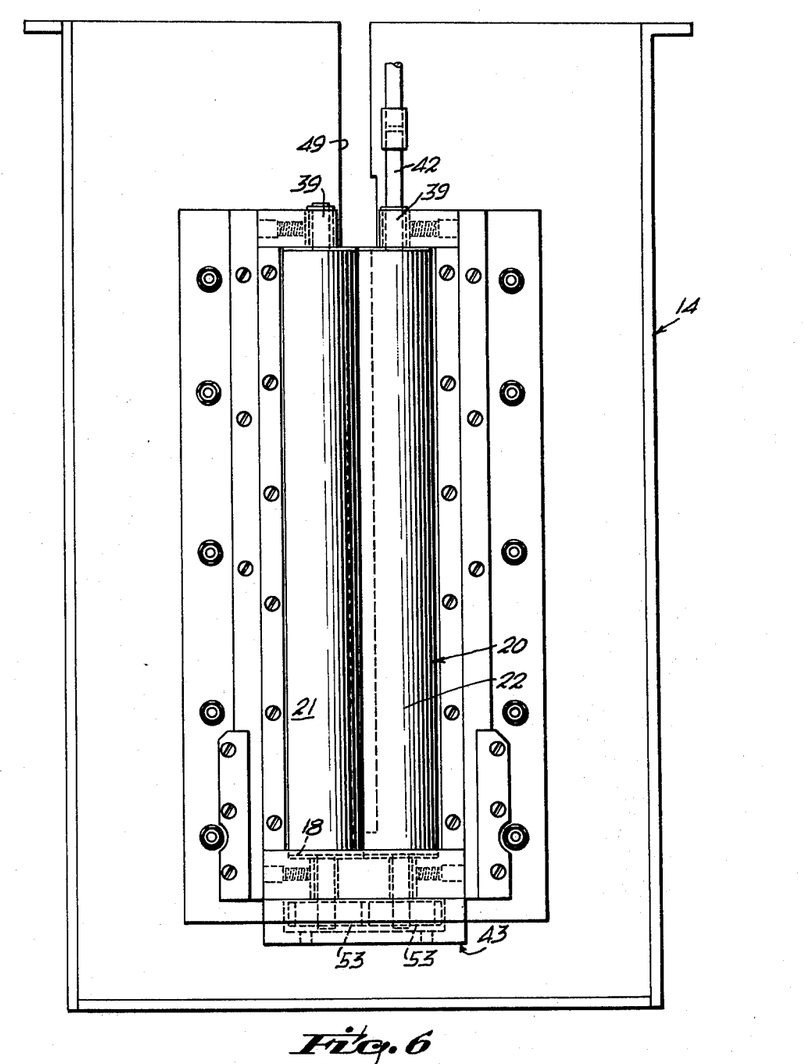
FIG. 6 is an end view of the roller assembly.

Turning now to FIG. 4, it will be seen that the inner plating tank 14 has its entry slot 24 positioned centrally at one end of the tank 14. The roller seal assembly 20 is secured by means of a back plate assembly 40 to the end of the plating tank 14. At the lower portion of the roller seal assembly 20 a gear housing 41 is provided, and the disk seals 18, preferably formed of teflon or polyethylene, are keyed to their respective rollers 21 and 22 for constant tangential frictional contact. As pointed out above, the spring loaded rollers themselves are provided with an elastomer which will give sufficiently to pass the printed circuit board 11, providing a minor source of leakage of the plating solution through the entry slot 24 (as well as the opposite exit slot). A drive shaft 42 is provided for one of the rollers 21, the gear housing 41 providing for a coordinated driving relationship of the opposite roller 22. The surface speed, in turn, is coordinated with the speed of the conveyor 15.

Figure 7:
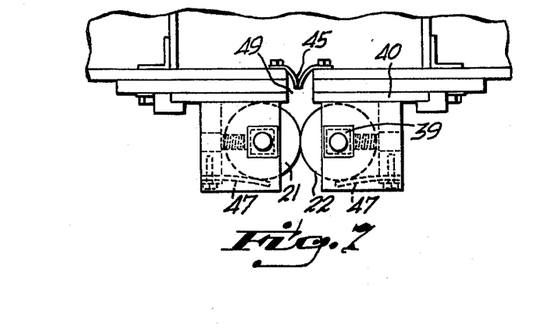
FIG. 7 is a top view of the roller assembly shown in FIG. 6.
Figure 8:
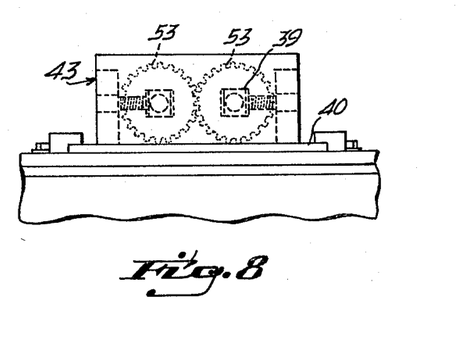
FIG. 8 is a bottom view of the roller assembly shown in FIG. 6, illustrating the gears in dotted lines.

Turning now to FIGS. 7 and 8, in greater detail, it will be seen that the bottom mount 43, along with the rollers 21, 22 includes a seal plate 47, one on each roller 21, 22 to further reduce leakage. Seal roller bearings 39 are provided at the top and the bottom as well, respectively spring loadedly urging the rollers 21, 22 as well as the gears 53, 53 into operative relationship.

In a ten foot inner plating tank 14, six printed circuit boards 11 (18" wide with 2" between) can be processed at one time at two feet per minute permitting five minutes of plating. Again in FIG. 7, it will be seen that an additional wiper seal assembly 45 is provided, in addition to the rollers 21 and 22, in this instance as shown at the exit slot 49 end of the inner plating tank 14.

The inner plating tank 14, as shown in FIG. 4 (and in more detail in FIG. 2) has spaced anode baskets 50. Two bus brackets 51 are provided at the top of each anode basket 50 and are secured in electrical contact with the anode bus 52 which also serves to support the anode basket 50 including its load of copper chips 54. Also insoluable anodes may be used in replacement of anode baskets when metal replacement of the metal exchange solution is provided with chemicals instead of soluable anode metals.

Vertical tubular spargers 55 are provided on alternate spacings at a mid-position between the anode baskets. The spargers 55 are provided with a vertical row of holes 58 directed to the anodes (see FIG. 2) and another vertical row of holes (56) directed toward the cathodes target or printed circuit board 11. The spargers 55 are fed by means of the manifold assembly 62 to which they are connected, the manifold assembly 62 in turn being supplied by the plating solution pump 13 through the plating solution lines 23.

In a typical commercial operation the fluid employed in the inner plating tank 14 is made up in 250 gallon batches. A typical copper plating station may consist of the following analysis:

| BATH COMPOSITION | OPTIMUM | RANGE |
| --- | --- | --- |
| Copper Sulfate | 14 oz/gal | 10-16 oz/gal |
| Sulfuric Acid | 25 oz/gal (10% by vol) | 22-28 oz/gal |
| Chloride | 50 ppm | 30-60 ppm |
| Micro-Brite CU Organic Brightener available from Micro Plate, Inc. of St. Petersburg, Florida | 0.5% by vol | 0.4-1% by vol |

A fluid plating pump solution 13 shown in FIG. 2 with a capacity of 300-500 gallons per minute is employed to constantly circulate the fluid through the spargers 55 to pass out through the overflow slots 60 in the inner tank 14, and drop to the bottom of the outer tank 19. Adjusting radial gates (61) are placed in the tank sides to control the solution level and the amount of solution overflow through slots (60). Drainage of the fluid leaking through the roller seal assembly 20 (as shown in FIG. 4) is passed by means of the drain pipe 48 into the pumping circuit plating reservoir 27 for continuously pumping the fluid in the inner tank 14.

By modularizing in eight foot units, and conveyorizing the printed circuit boards 11, it will be seen that they can (as shown in FIG. 1) be subsequently passed through a rinsing station 65, and thereafter to a tin lead plating station 70. In addition, the conveyor 15, being essentially endless, continues to transport the printed circuit boards 11 by means of the work hanger 12 into many other operational stations such as resist stripping, copper etching, tin lead reflowing, cleaning, spray rinsing, hot air drying, oxidizing, etc., thus completing the processing of the printed circuit board 11.

THE METHOD

The method contemplated by the present invention commences with the step of conveyorizing a workpiece such as a printed circuit board 11 for continuous horizontal transport while oriented vertically. A plating tank is provided, which the method contemplates sealing at both ends for the passage of a printed circuit board 11 through an entry slot and exit slot 24, 49. The workpiece is energized electrically while in the plating tank and in the plating solution. The fluid in the tank is also energized for metal exchange, the fluid being in intimate wetting contact with the workpiece. Additional specifics of the method include drivingly engaging the PC board 11 by means of opposed driven vertical rollers in timed relationship to the transport of the conveyor 15, and passing the workpiece through the inner plating tank 14. Voltages in the order of 1-12 volts are employed with current densities as high as 500 Amps/$f^2$ in a typical plating cell. It will be appreciated that the current density will vary in accordance with the speed of transport of the PC boards 11 a range of between 100 to 500 Amps/$f^2$ being desired. The agitation of the plating cells is approximately 300 gallons per minute. This agitation is desirably spread over an eight foot plating cell, although where a five foot plating cell is employed the same agitation rate exists. In most cases the maximum loading of the plating cell is 32 square feet of printed circuit board per eight foot cell. Nozzle pressures approximate 20-30 psi thus providing a high rate of fluid contact and agitation in combination with the high current densities per square foot to avoid polarization where such high current densities exist.

ALTERNATIVE EMBODIMENT AND METHOD

Figure 10:
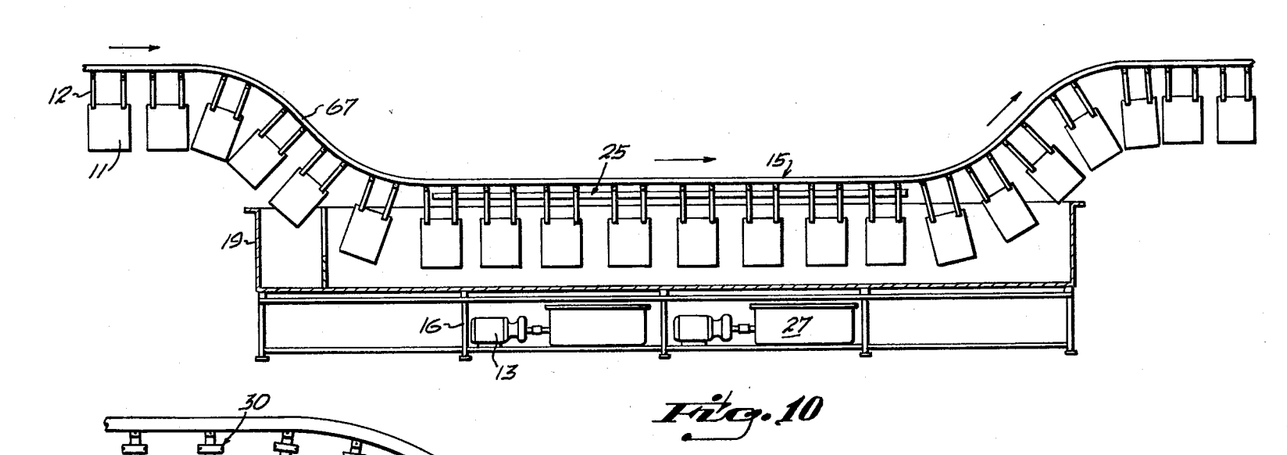
FIG. 10 is a front elevation, partially diagrammatic, showing an alternative embodiment of the apparatus and method using a single conventional type of plating tank (shown in cross-section)
Figure 11:
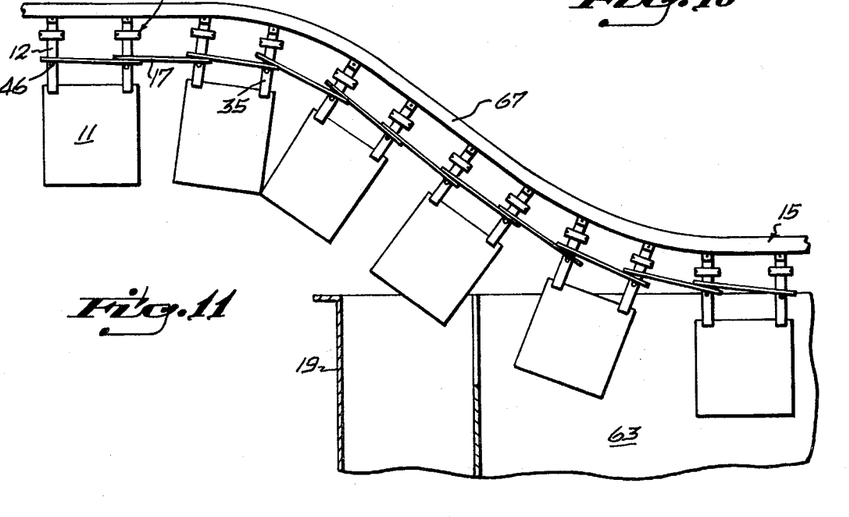
FIG. 11 is an enlarged section of the left-hand portion of FIG. 10 illustrating in greater detail the curved section on the conveyor.

The alternative embodiment and method are illustrated in FIGS. 10-11. The same reference numerals are noted as in the primary embodiment and method. The principal distinction between the alternative embodiment and the principal embodiment just described is the provision of a curved section 67 in the conveyor 15 which, because the plating tank is lengthened, permits dipping the PC boards 11 into the fluid in a conventional plating tank 63. The contact track assembly 25 begins and ends at a position remote from the two ends of the inner plating tank 14. The contact bars 26 are provided with flared ends 28, in the same fashion as shown partially diagrammatically in FIG. 3. The plastic chain links 33 are the same as shown in the principal embodiment, as well as the cover 68, the position of the spargers 55, and the anode basket 50. For purposes of illustration, the section shown in FIG. 2 is appropriate for this embodiment. Optionally lateral guides (not shown) may be desirable and fixed in dependent form from the curved portion 67 of the conveyor to stabilize the PC boards 11 prior to total immersion, and to guide the same for the entry of the contact shoe assembly 30 into the contact track assembly 25. With the exception of the distinctions just outlined, both the method and the apparatus of the alternative embodiment are substantially the same that shown and described in greater detail in the first embodiment and method described above.

Although particular embodiments of the invention have been shown and described in full here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

We claim:

1. The method of continuous metal exchange for workpieces such as printed circuit boards in a tank comprising the steps of conveyorizing the workpieces for comtinuous horizontal transport while the workpiece is in a vertical plane;

sealing the opposite ends of the tank while providing for passing the workpieces through the seal into and out of the tank;

rendering the workpieces conductive while in the tank;

and providing a fluid in the tank energized for metal exchange in intimate contact with the workpiece, whereby plating or deplating or other forms of metal exchange can be continuously accomplished on the workpieces.

2. A plating station for continuous plating of workpieces such as printed circuit boards suspended in a vertical plane by a hanger for horizontal transport comprising, in combination, horizontal conveyor means, work hangers in spaced relation suspended from the conveyor, workpiece securing means on said hangers, a plating tank having a vertical end entry slot and exit slot to pass the workpieces suspended from the hangers, a pair of sealing rollers in tangential contact flanking said slots, providing solution agitation directed at the anode and cathode.

3. In the plating station of claim 2, said hangers having an insulated upper portion and conductive lower portion, conductive shoes on each hanger secured to the conductive portion above the tank fluid level, a conductive track for engaging the shoes spaced above the tank fluid and parallel to the conveyor.

4. In the plating station of claim 2, said pair of rollers having top and bottom mounts, sealing means on the bottom mount to inhibit fluid which passes through the slots from leaking at the lower mount for the rollers.

5. A plating station for continuous plating of workpieces such as printed circuit boards suspended by a hanger for continuous transport comprising, in combination, a plating tank having end vertical workpiece slots for passing the workpieces, sealing means adjacent such slots, conveyor means suspending the workpieces in a vertical plane for horizontal transport into and out of the tank slots, and means for rendering the workpieces conductive while in the tank, whereby a plurality of workpieces may be continuously plated in the tank.

6. In the plating station of claim 5 above, a plurality of inert chain plate members secured to each of said hangers for the workpieces, said chain plates being provided with slots at each end to receive an adjacent pair of work hangers, means for supporting said chain plates at a position beneath the conductive connection to the electrical means, a cover positioned atop the tank having a slot in the mid-portion, said chain plates being in spaced relation to the conveyor and the hangers to overlie the slot in the cover, whereby fumes from the tank are inhibited from passing out of the slot in the cover and the electrical means are shielded by positioning the chain plate beneath the electrical means on the work hanger.

7. In the plating station of claim 6 above, each chain plate having elongate slots at its remote ends for receiving the work hanger, extension means on each work hanger to underlie the slots in each chain plate thereby supporting the same above the workpiece and in spaced relationship to the slot in the cover for the tank, said extension means having a length less than the width of the slot in the cover for the plating tank.

8. The method of continuous metal exchange for workpieces in a tank comprising the steps of conveyorizing the workpieces for continuous transport while the workpiece is in a vertical plane;

means for transporting the workpiece into and out of the tank for plating;

means for rendering the workpieces conductive while in the tank;

providing a fluid in the tank energized for metal exchange in intimate contact with the workpiece;

providing a chain plate at a mid-portion on the work hanger for supporting the workpieces at a point below the electrical contact means, positioning a cover over the tank having a slotted mid-portion narrower than the chain plates, positioning the chain plates to overlie the slot in the cover, moving the workpiece in a substantially horizontal path while the workpiece is in a vertical plane passing through the fluid in the tank which is energized; whereby plating or deplating or other forms of metal exchange can be continuously accomplished on the workpiece.

9. In the method of claim 8 above, providing means at the remote ends of the tank to raise and lower the workpieces into and out of the tank.

10. In the method of claim 1 above, providing a current density between the workpieces and fluid in the range of 100–500 Amps per square foot.

11. The method of continuous metal exchange for workpieces in a tank comprising the steps of conveyorizing the workpieces for continuous transport while the workpiece is in a vertical plane;

means for transporting the workpiece into and out of the tank for plating;

means for rendering the workpieces conductive while in the tank;

providing a fluid in the tank energized for metal exchange in intimate contact with the workpiece;

moving the workpiece in a substantially horizontal path while the workpiece is in a vertical plane passing through the fluid in the tank which is energized;

providing a work hanger for the workpiece which depends from the means for conveyorizing the same, rendering the upper portion of the means for conveyorizing non-conductive and the lower portion conductive, providing electrical contact means on the conductive portion of the workpiece, providing electrically conductive track means for cooperative electrical contact relationship with the electrical contact means on the conductive portion of said workpiece support, providing a chain plate at a mid-portion on the work hanger for supporting the workpieces at a point below the electrical contact means, positioning a cover over the tank having a slotted mid-portion narrower than the chain plates, positioning the chain plates to overlie the slot in the cover, whereby plating or deplating or other forms of metal exchange can be continuously accomplished on the workpiece.

12. In the method of claim 11 above, providing means at the remote ends of the tank to raise and lower the workpieces into and out of the tank.

13. In the method of claim 11 above, providing a current density between the workpieces and fluid in the range of 100–500 Amps per square foot.

14. A plating station for continuous plating of workpieces suspended in a vertical plane by a hanger for substantially horizontal transport comprising, in combination, horizontal conveyor means, work hangers in spaced relation suspended from the conveyor, workpiece securing means on said hangers, a plating tank having a fluid in the tank energized for metal exchange in intimate contact with the workpiece, means for continuously transporting the workpiece into and out of the tank, a portion of said work hangers being electrically conductive, a plurality of inert chain plate members engaging each of said hangers for the workpieces, said chain plates being provided with slots at each end to receive an adjacent pair of work hangers, means for supporting said chain plates at a position beneath the non-conductive portion of the work hangers, a cover positioned atop the tank having a slot in a mid-portion, said chain plates being in spaced relation to the conveyor and the supports to overlie the slot in the cover, and means above the fluid in the tank for electrically contacting the conductive portion of the work hangers, whereby the workpieces may be the subject of metal exchange while continuously passing in a vertical plane into and out of the solution in the tank.

15. In the plating station of claim 14 above, downwardly curving portions of the conveyor at the remote ends of the tank proportioned to lower the workpiece into the fluid for metal exchange and to raise the workpieces from the fluid at the remote end of the tank, whereby the workpieces are continuously horizontally transported into and out of a closed plating tank.

16. In the plating station of claim 14 above, each chain plate having elongate slots at its remote ends for receiving the work hanger, extension means on each work hanger to underlie the slots in each chain plate thereby supporting the same above the workpiece and in spaced relationship to the slot in the cover of the tank, said extension means having a length less than the width of the slot in the cover for the plating tank.

17. In the plating station of claim 14 above, each chain plate having elongate slots at its remote ends for receiving the work hanger, extension means on each work hanger to underlie the slots in each chain plate thereby supporting the same above the workpiece and in spaced relationship to the slot in the cover of the tank, said extension means having a length less than the width of the slot in the cover for the plating tank.

18. The method of continuous metal exchange for workpieces in a tank comprising the steps of conveyorizing the workpieces for continuous transport while the workpiece is in a vertical plane;

means for transporting the workpiece into and out of the tank for plating;

providing the workpiece with a pair of horizontally opposed yieldable shoes which are in electrical communication with the lower portion of the workpiece and, each of said shoes being yieldable in an opposed horizontal direction, and a pair of opposed parallel contact bars comprising a contact track assembly between which the opposed yieldable shoes slide and are thereby stabilized and in yieldable electrical contact, means for rendering the workpieces conductive while in the tank, providing a fluid in the tank energized for metal exchange in intimate contact with the workpiece, moving the workpiece in a substantially horizontal path while the workpiece is in a vertical plane passing through the fuid in the tank which is energized, whereby plating or deplating or other forms of metal exchange can be continuously accomplished on the workpiece.

19. In the method of claim 18 above, providing means at the remote ends of the tank to raise and lower the workpieces into and out of the tank.

20. In the method of continuous metal exchange of claim 18 above, providing a chain plate at a mid-portion on the work hanger for supporting the workpieces at a point below the electrical contact means, positioning a cover over the tank having a slotted mid-portion narrower than the chain plates, positioning the chain plates to overlie the slot in the cover, whereby fumes from the fluid in the tank are inhibited from exiting through the slot and the chain plate shields the electrical contact means from such fumes.

21. In the method of continuous metal exchange of claim 19 above, providing a chain plate at a mid-portion on the work hanger for supporting the workpieces at a point below the electrical contact means, positioning a cover over the tank having a slotted mid-portion narrower than the chain plates, positioning the chain plates to overlie the slot in the cover, whereby fumes from the fluid in the tank are inhibited from exiting through the slot and the chain plate shields the brush means from such fumes.

22. In the method of claim 18 above, providing a current density between the workpieces and fluid in the range of 100–500 Amps per square foot.

* * * * *